United States Patent
Carbone

(10) Patent No.: US 6,335,644 B1
(45) Date of Patent: Jan. 1, 2002

(54) METHOD FOR SYNTHESIZING A CLOCK SIGNAL AND SYNTHESIZING DEVICE THEREOF

(75) Inventor: Stefano Carbone, Milan (IT)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/516,512

(22) Filed: Mar. 1, 2000

(30) Foreign Application Priority Data

Mar. 15, 1999 (IT) .......................................... TO99A0201

(51) Int. Cl.[7] .................................................. H03L 7/00
(52) U.S. Cl. ........................ 327/141; 327/107; 327/105; 708/271
(58) Field of Search ................................ 327/156, 141, 327/105, 107; 331/1 A, 14; 708/271

(56) References Cited

U.S. PATENT DOCUMENTS 5,459,435 A * 10/1995 Taki ........................... 327/141
5,579,351 A    11/1996 Kim ........................... 375/371
5,638,014 A     6/1997 Kurita ......................... 327/141

FOREIGN PATENT DOCUMENTS

| EP | 0 766 404 A2 | 4/1997 |
| JP | 10 147 005 A | 6/1998 |

* cited by examiner

*Primary Examiner*—Dinh T. Le
(74) *Attorney, Agent, or Firm*—Sughrue Mion, PLLC

(57) ABSTRACT

A method for synthesizing a clock signal, said clock signal being locked to a reference clock signal, said method providing for using a third clock signal, operating at a higher frequency. The method provides the steps of: measuring the reference clock signal (CK_REF) by means of the third clock signal (CK_HIGH), operating at a higher frequency, obtaining a measured value (MES) of the reference clock signal (CK_REF) frequency; comparing the measured value (MES) with a nominal value; obtaining a correction value (CRR) as a function of the measured value (MES) and storing said correction value (CRR); using said correction value (CRR) for driving a digital controlled oscillator (OC) that outputs the synthesized clock signal (CK_SYN).

16 Claims, 2 Drawing Sheets

METHOD FOR SYNTHESIZING A CLOCK SIGNAL AND SYNTHESIZING DEVICE THEREOF

BACKGROUND OF THE INVENTION

1. Field of the Invention

The present invention relates to a method for synthesizing a clock signal, said signal being locked to a reference clock signal.

2. Description of the Prior Art

When developing digital communication systems, a condition is often faced where a clock signal of a desired frequency having frequency stability and low jitter has to be generated, deriving said signal from clock signals already available in the system and operating at preset frequencies, said clock signals being affected themselves by jitter.

The use of circuits based on closed loop circuits, in particular PLL circuits (Phase Locked Loop), represents the most widely employed solution for said problem.

However, though closed loop circuits are able to synthesize clock signals of a desired frequency with flexibility and good frequency features, they are expensive, bulky and high power consuming. This creates a hindrance to their integration in digital circuits.

On the other hand, manufacture of open loop circuits has the problem of efficiently compensating the jitter on the reference clock signal, avoiding to bring it to the output.

SUMMARY OF THE INVENTION

It is the object of the present invention to solve the above problems and provide a method for synthesizing a clock signal locked to a reference clock signal, having a more efficient and improved performance.

In this frame, it is the main object of the present invention to provide a method for synthesizing a clock signal locked to a reference clock signal, which has a simple implementation and is easily integrated in digital circuits.

A further object of the present invention is to provide a method for synthesizing a clock signal locked to a reference clock signal, through which a low jitter clock signal can be synthesized.

A further object of the present invention is to provide a method for synthesizing a clock signal locked to a reference clock signal, which has an open loop and, in particular, does not make use of PLL circuits.

A further object of the present invention is to provide a synthesizing device for digital clock signals ensuring the achievement of the method according to the present invention.

In order to achieve such objects, the present invention provides a method for synthesizing a clock signal locked to a reference clock signal and/or a synthesizing device for digital clock signals incorporating the features of the annexed claims, which form an integral part of the description herein.

Further objects, features and advantages of the present invention will become apparent from the following detailed description and annexed drawings, which are supplied by way of exemplifying and non limiting example.

DESCRIPTION OF THE BEST MODE FOR CARRYING OUT THE INVENTION

Figure 1:
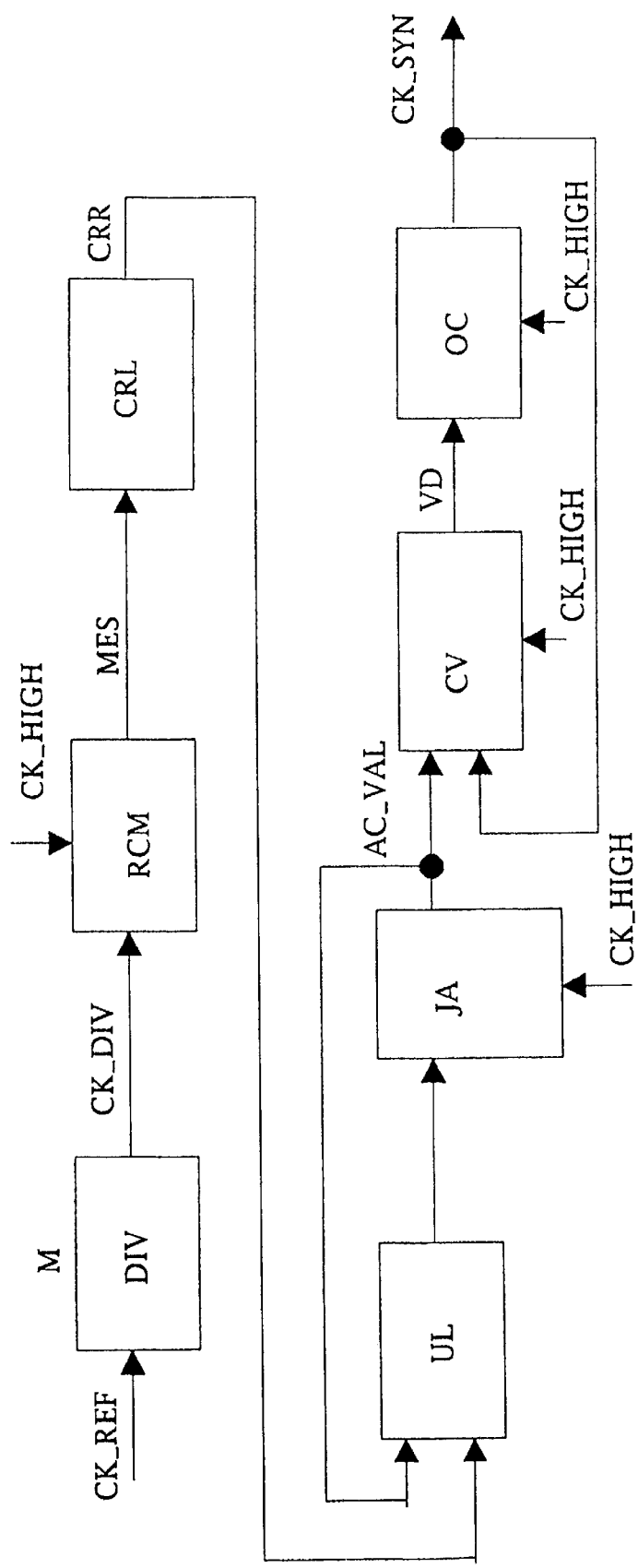
FIG. 1 shows a block diagram representing the method for synthesizing a clock signal locked to a reference clock signal, according to the present invention.

Shown in FIG. 1 is a block diagram representing the method for synthesizing a clock signal, said clock being locked to a reference clock signal, according to the present invention.

A reference clock signal CK_REF goes to the input of a divider block DIV, which divides its frequency by a preset division factor M. Therefore, a divided clock signal CK_DIV will be available at the output and goes to the input of a measure block RCM along with a high frequency clock signal CK_HIGH, which is asynchronous with respect to the reference clock signal CK_REF and has a much higher frequency with respect to the divided clock signal CK_DIV. The measure block RCM will compare the divided clock signal CK_DIV with the high frequency clock signal CK_HIGH and output a measured value MES, which corresponds to the number of cycles of the high frequency clock signal CK_HIGH within a cycle of the divided clock signal CK_DIV In other words, the measure block RCM is substantially representing a counter. The measured value MES is then sent to a correction logical block CRL performing the following function: on the basis of a correspondence table contained therein, it associates a corresponding correction value CRR to the measured value MES. Said correction value CRR is sent to an update logical block UL, which in turn controls a jitter accumulation block JA. The accumulation block JA, which is driven by the high frequency clock signal, will output an accumulation value AC_VAL. Said accumulation value AC_VAL is fedback to the update logical block UL and moreover it is sent downstream to an oscillator controller CV which is followed by a digital controlled oscillator OC, namely a digital Voltage Controlled Oscillator, i.e. substantially a programmable divider of the high frequency clock signal CK_HIGH.

The function of the oscillator controller CV, that is achievable through a finite states machine, is to send, on the basis of the accumulation value AC_VAL, a division value VD to the digital controller oscillator OC, so that the digital controlled oscillator OC output a synthesized clock signal CK_SYN which is frequency-locked to the reference clock signal CK_REF.

Thus the operation provides for:

measuring the reference clock signal CK_REF by means of the high frequency clock signal CK_HIGH, obtaining a measured value MES of the frequency of the reference clock signal CK_REF;

comparing the measured value MES with a nominal value, which is contained in a correspondence table in the correction logical block CRL;

obtaining then a correction value CRR as a function of the measured value MES storing the correction value CRR, using an accumulation method through the jitter accumulative block JA;

using the correction value CRR as an accumulation value AC_VAL for controlling, through the oscillator controller CV, the digital controlled oscillator OC that produces the synthesized clock signal CK_SYN.

Figure 2:
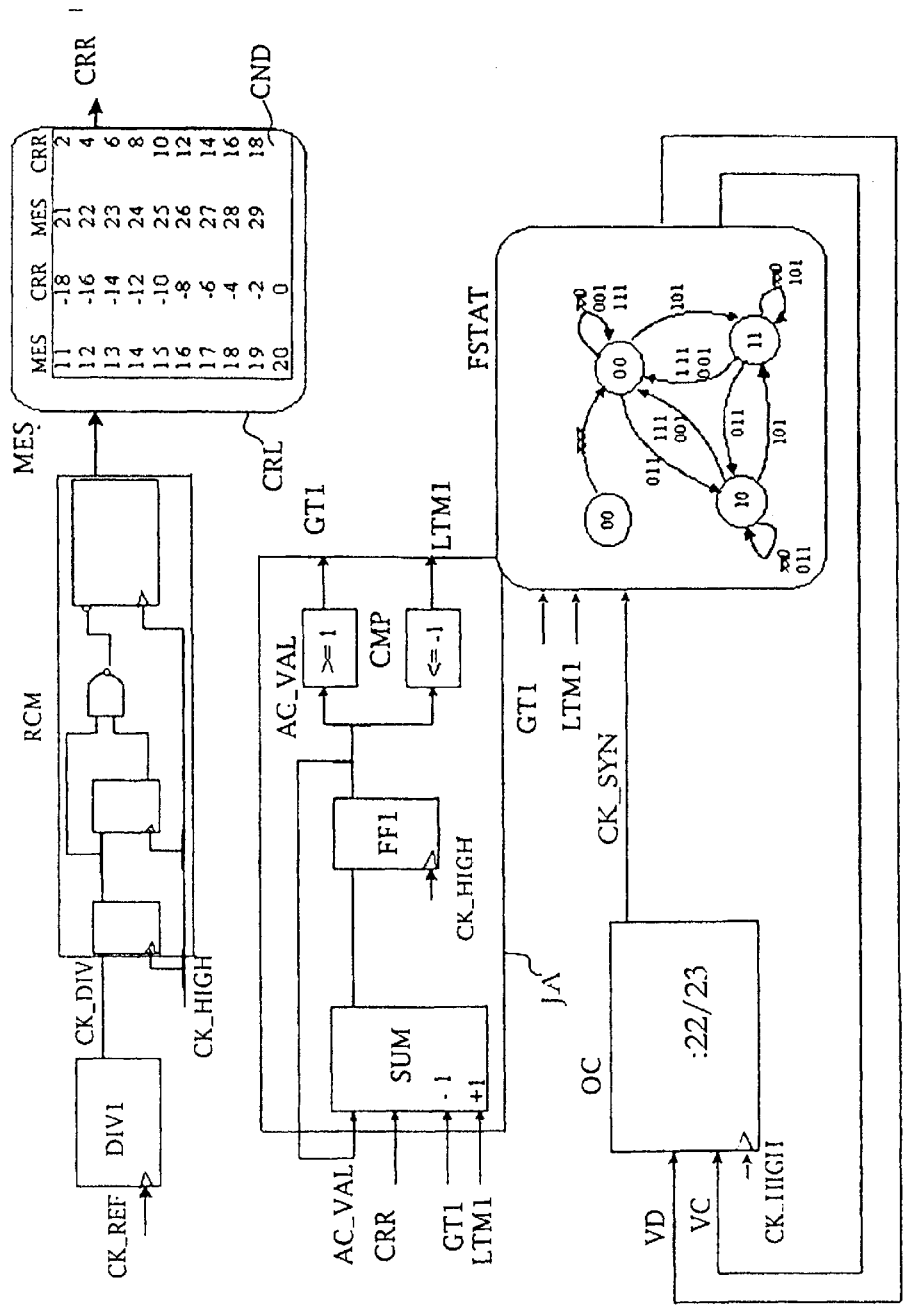
FIG. 2 shows a basic schematic diagram of a circuit generating the method for synthesizing a clock signal locked to a reference clock signal, according to the present invention.

FIG. 2 shows a synthesizing device representing a preferred implementation of the method for synthesizing a clock signal locked to a reference clock signal according to the present invention.

The reference clock signal CK_REF having e.g. a 8192 KHz frequency, goes to the input of a divider block DIV1, with a division ratio M equal to 64. Then at the output there will be a divided clock signal CK_DIV at 128 KHz frequency. The high frequency clock signal CH_HIGH operates at 51,84 MHz frequency, whereas the desired synthesized clock signal CK_SYN will have to operate at 2304 kHz frequency. The measure block RCM is obtained through an edge detector and module counter 64, i.e. said counter will reach saturation several times within a cycle of the divided clock signal CK_DIV. In fact, the number of cycles executed by the counter is obtained from the operation 51,84 MHz/(128 KHz×64)=6.32; such a measure allows achievement of a globally simpler system. The measured value MES is then sent to the correction logical block CRL containing a correspondence table CND which, as shown in FIG. 2, will put each measured value MES in correspondence with a correction value CRR, the latter being a value with a sign, as it can be seen. The correction value CRR so obtained is sent to the input of a summing block SUM. Said summing block SUM also receives at its input the accumulation value AC_VAL, as accumulated in the previous cycle. Finally, at the input of the summing block SUM there is a signal GT1 which is greater than one and a signal LTM1 which is smaller than minus one, whose origin and function will be better explained in the following. The summing block SUM is followed by a D-type register FF1; at its output the accumulation value AC_VAL is returned as feedback to the input of the summing block SUM. The summing block SUM and register FF1 correspond to the jitter accumulative block JA. The accumulation value AC_VAL is evaluated by a comparing block CMP which operates according to the following rules:

if the accumulation value AC_VAL is greater than one or equal to one, it will place the signal GT1, which is greater than one, at the level of logical one;

if the accumulation value AC_VAL is smaller than minus one or equal to minus one, it will place the signal LTM1, which is smaller than minus one, at the level of logical one;

supplying said greater than one signal GT1 and smaller than minus one signal LTM1 to a finite states machine FSTAT. Said finite states machine FSTAT, along with the comparison block CMP, corresponds substantially to the oscillator controller CV shown in FIG. 1. As mentioned, the signal GT1 which is greater than one and the signal LTM1 which is smaller than minus one are sent to the input also of the summing block SUM, where, when at high logical level, they cause either a decrement or increment of one of the accumulation value AC_VAL. Thus, the accumulation value AC_VAL will converge to zero along with the updating operations.

The finite states machine FSTAT outputs two signals, which are sent to the digital controlled oscillator OC. Said digital controlled oscillator OC is obtained by a divisor with a programmable division ratio ranging from value 22 to value 23. The synthesized clock signal CK_SYN generated at the output of the digital controlled oscillator OC is brought as feedback to the finite states machine FSTAT. The finite states machine FSTAT sends the division value VD, which in this case—being the division ratios just two—corresponds to a fast/slow signal for counting purposes. Moreover, as it can be seen in the finite states machine diagram FSTAT, it sends a correction signal SC, whose value is 0 if no correction is required and 1 if a correction has to be executed, for instructing the controlled oscillator OC to oscillate according to the division value VD. Therefore, the finite states machine FSTAT will control the period duration of the synthesized clock signal through the division value VD, and supply it longer, shorter or equal to the nominal period as to whether the accumulation value AC_VAL, represented by the jitter of the reference clock signal CK_REF, is equal or greater than one, equal or smaller than minus one or equal to zero, respectively.

Moreover, the finite states machine FSTAT controls operation of the summing block SUM, so that the jitter accumulation block JA will always tend to converge towards the zero value of the accumulation value AC_VAL. Thus, the correction on a single time interval of the synthesized clock signal CK_SYN will at its maximum be a unit in terms of the arithmetic of the jitter accumulation block JA, i.e., in this particular implementation, only half the time period of the high frequency clock signal CK_HIGH.

Therefore, the procedure consists in measuring the reference clock signal CK_REF, or a properly divided frequency signal, such as the divided clock signal CK_DIV by means of an independent high frequency clock signal CK_HIGH. The measured value MES does not entail any corrections if it has the nominal value (MES=20 of the correspondence table CND represented in FIG. 2). If it is smaller or greater, a correction value CRR will be sent, i.e. a number with a sign, to be stored in the jitter accumulation block JA, which operates substantially like a memory. The finite states machine FSTAT makes use of said memory for controlling the digital oscillator OC, so as to distribute the jitter resulting from the jitter accumulation block JA on some cycles of the synthesized clock signal CK_SYN. The same signals GT1 and LMT1 which are used by the finite states machine FSTAT for deciding the division value VD, are also employed for updating the jitter accumulation block JA and prevent the accumulation value AC_VAL from diverging.

In other words, the accumulation value AC_VAL, i.e. the difference with respect to a stored nominal value, represents, in terms of high frequency clock signal CK_HIGH, a time deviation to be reported on the synthesized clock signal CK_SYN by distributing it on some of its cycles corresponding to an entire measure time interval. Thus, the reference clock signal CK_REF and synthesized clock signal CK_SYN are locked to each other.

From the above description the features of the present invention will be clear, as well as its advantages.

The method for synthesizing a clock signal locked to a reference clock signal according to the present invention allows a simple implementation and easy integration in digital circuits. In fact, the achievement of an open loop system and consequently the lack of phase locked loops, i.e. PLL, strongly reduces overall dimensions on the chip and relevant costs. Moreover, the method for synthesizing a clock signal locked to a reference clock signal allows synthesizing a very low jitter lock signal, since corrections are at their maximum half a period of the high frequency clock signal.

Moreover, advantageously, by changing the size of the jitter accumulative block, it is possible to have the method for synthesizing a clock signal locked to a reference clock signal tolerating different jitter peaks, generating at the output in any case a synthesized clock signal with the same jitter peak.

It is obvious that many changes are possible for the man skilled in the art to a method for synthesizing a clock signal locked to a reference clock signal and/or a synthesizing device of digital clock signals described above by way of example, without departing from the novelty spirit of the innovative idea, and it is also clear that in practical actuation of the invention the components may often differ in form and size from the ones described and be replaced with functionally equivalent elements.

I claim:

1. A method for synthesizing a clock signal, said clock signal being locked to a reference clock signal having a reference clock signal frequency, said method using a further clock signal operating at a further clock signal frequency higher than said reference clock signal frequency, wherein the method comprises the steps of:

dividing the reference clock signal frequency by a division factor and obtaining a divided clock signal having a divided clock signal frequency;

comparing said divided clock signal frequency with said further clock signal frequency and obtaining a measured value of the reference clock signal frequency, said further clock signal being asynchronous with respect to the reference clock signal and having a much higher frequency with respect to said divided clock signal;

comparing said measured value with a nominal value;

obtaining a correction value as a function of the measured value and storing said correction value; and controlling a digital controlled oscillator that outputs the synthesized clock signal in accordance with said correction value.

2. A method according to claim 1, further comprising the steps of:

providing said correction value to updating memory means, said memory means storing said correction value as an accumulation value; and driving said digital controlled oscillator by means of control logical means which are fed with said accumulation value.

3. A method according to claim 2, further comprising a step, carried out by said control logical means, of comparing said accumulation value and outputting a two-valued differential control signal, wherein, if the accumulation value is equal to or greater than one, a first control signal (GT1) is set to a level of logical one and provided to a finite state machine.

4. A method according to claim 2, further comprising the steps of providing memory means and supplying said first control signal as a feedback for updating said memory means, to permit the accumulation value to converge to zero.

5. A method according to claim 2, further comprising a step, carried out by control logical means, of comparing said accumulation value and outputting a two-valued differential control signal, wherein, if the accumulation value is equal to or smaller than minus one, a first control signal (LTM1) is set to the level of logical one and provided to a finite state machine.

6. A method according to claim 3, further comprising a step, carried out by control logical means, of comparing said accumulation value and outputting a two-valued differential control signal, wherein, if the accumulation value is equal to or smaller than minus one, a second control signal (LTM1) is set to the level of logical one and provided to a finite state machine.

7. A synthesizing device for digital clock signals, said device comprising:

an input receiving a reference clock signal having a reference clock signal frequency and a high frequency clock signal having a high frequency clock frequency, an output for outputting a synthesized clock signal through a digital controlled oscillator, wherein the device further comprises:

a divider for dividing said reference clock signal frequency by a division factor and obtaining a divided clock signal having a divided clock signal frequency;

a first comparison circuit comparing said divided clock signal frequency with the frequency of said high frequency clock signal and obtaining a measured value of the reference clock signal frequency, said high frequency clock signal being asynchronous with respect to the reference clock signal and having a much higher frequency with respect to said divided clock signal;

a further comparison circuit comparing said measured value with a nominal value and outputting a correction value; and an updating accumulator receiving said correction value and outputting a differential control signal for controlling said synthesized clock signal.

8. A device according to claim 7, wherein said updating accumulator accumulates an accumulation value that is fed back to said updating accumulator.

9. A device according to claim 8, wherein said updating accumulator comprises a summing device receiving said correction value, said accumulation value and said differential control signal as inputs.

10. A device according to claim 7, wherein said digital controlled oscillator comprises logical controller receiving said differential control signal and generating an oscillator control signal for said digital controlled oscillator.

11. A device according to claim 7, wherein said logical controller comprises a finite state machine.

12. A device according to claim 10, wherein said digital controlled oscillator further comprises a programmable divider, said divider being programmable between a first division ratio and a second division ratio.

13. A device according to claim 12, wherein said oscillator control signal comprises a division value for setting said programmable divider.

14. A device according to claim 13, wherein said oscillator control signal further comprises a correction signal.

15. A device according to claim 7, wherein said first comparison circuit comprises an edge detector.

16. A device according to claim 7, wherein said further comparison circuit comprises a table of correction values corresponding to measured frequency values.

* * * * *